(12) United States Patent
Miura

(10) Patent No.: US 11,177,635 B2
(45) Date of Patent: Nov. 16, 2021

(54) LIGHT SOURCE DEVICE

(71) Applicant: Ushio Denki Kabushiki Kaisha, Tokyo (JP)

(72) Inventor: Yuichi Miura, Tokyo (JP)

(73) Assignee: Ushio Denki Kabushiki Kaisha, Tokyo (JP)

(*) Notice: Subject to any disclaimer, the term of this patent is extended or adjusted under 35 U.S.C. 154(b) by 185 days.

(21) Appl. No.: 16/744,990

(22) Filed: Jan. 16, 2020

(65) Prior Publication Data

US 2020/0235549 A1    Jul. 23, 2020

(30) Foreign Application Priority Data

Jan. 17, 2019  (JP) .............................. JP2019-006041

(51) Int. Cl.
| | |
|---|---|
| *H01S 5/00* | (2006.01) |
| *H01S 5/40* | (2006.01) |
| *H01S 5/14* | (2006.01) |
| *H01S 5/02251* | (2021.01) |
| *H01S 5/02253* | (2021.01) |
| *H01S 3/109* | (2006.01) |

(52) U.S. Cl.
CPC ............ *H01S 5/4012* (2013.01); *H01S 3/109* (2013.01); *H01S 5/02251* (2021.01); *H01S 5/02253* (2021.01); *H01S 5/141* (2013.01); *H01S 5/005* (2013.01); *H01S 5/0071* (2013.01); *H01S 5/4025* (2013.01)

(58) Field of Classification Search
CPC .... H01S 5/4012; H01S 5/4025; H01S 5/0071; H01S 5/02253; H01S 5/02251; H01S 5/141; H01S 5/005
See application file for complete search history.

(56) References Cited

U.S. PATENT DOCUMENTS

| | | | | |
|---|---|---|---|---|
| 7,561,612 B2* | 7/2009 | Kumagai | ................... | H01S 5/14 372/100 |
| 2006/0104326 A1* | 5/2006 | Kim | ...................... | B82Y 20/00 372/43.01 |
| 2008/0151949 A1* | 6/2008 | Takeda | ................... | H01S 5/4025 372/22 |
| 2008/0159736 A1* | 7/2008 | Kamijima | ............ | H04N 9/3161 398/9 |

FOREIGN PATENT DOCUMENTS

JP           2014187138 A     10/2014

* cited by examiner

*Primary Examiner* — Kinam Park
(74) *Attorney, Agent, or Firm* — Studebaker & Brackett PC

(57) ABSTRACT

The light source device includes an external resonator type semiconductor laser light source that includes a wavelength conversion element and emits light having a wavelength converted by the wavelength conversion element from a first light emission region and a second light emission region different from the first light emission region, a first optical waveguide and a second optical waveguide that each include an incident surface having a circular shape and emit light from light emission surfaces to a same irradiation surface, a first condensing optical system that condenses a plurality of first light bundle of rays emitted from the first light emission region on the incident surface of the first optical waveguide; and a second condensing optical system that condenses a plurality of second light bundle of rays emitted from the second light emission region on the incident surface of the second optical waveguide.

20 Claims, 12 Drawing Sheets

LIGHT SOURCE DEVICE

BACKGROUND OF THE INVENTION

Field of the Invention

The present invention relates to a light source device, and especially relates to a light source device using light emitted from an external resonator type semiconductor laser light source.

Description of the Related Art

Conventionally, an external resonator type semiconductor laser light source is known as one of light source devices, and the external resonator type semiconductor laser light source is known to emit light from a plurality of regions in order to improve light extraction efficiency. The present applicant develops a laser light source which converts a wavelength of a plurality of basic lights emitted from a semiconductor device by a wavelength conversion element and emits lights of the same wavelength band from two different light emission regions (refer to following Patent Document 1).

PRIOR ART DOCUMENT

Patent Document

Patent Document 1: JP-A-2014-187138

SUMMARY OF THE INVENTION

Herein, in order to condense lights emitted from a laser light source including a plurality of light emission regions, a method of condensing using a condenser lens is conceivable. However, the present inventor examined a light source device which condenses lights of the same wavelength band emitted from a plurality of emission regions by a condenser lens such as the laser light source disclosed in Patent Document 1 mentioned above and found that there is the following problem. Hereinafter, this is described with reference to the drawings.

First, an example of a configuration of a laser light source 10 including two light emission regions (10a and 10b) disclosed in Patent Document 1 mentioned above is described as the laser light source including the plurality of light emission regions. FIG. 1A is a schematic side view illustrating a configuration of the external resonator type semiconductor laser light source disclosed in Patent Document 1 mentioned above.

FIG. 1B is an enlarged view of a semiconductor device 101 illustrated in FIG. 1A as seen in a light emitting direction (Z direction in FIG. 1A). As illustrated in FIG. 1B, light of a specific wavelength of the light emitted from light emitting units 102 formed in an array on the semiconductor device 101 is reflected by a Volume Bragg Gratings (VBG) 103. The light reflected by the VBG 103 is repeatedly reflected between the same and the semiconductor device 101 to oscillate. The light repeatedly reflected between the semiconductor device 101 and the VBG 103 is gradually converted into light of a predetermined wavelength band by a wavelength conversion element 104.

The light converted into the light of the predetermined wavelength band by the wavelength conversion element 104 passes through the VBG 103 to be emitted as it is from the first light emission region 10a. The rest of the light converted into the light of the predetermined wavelength band is guided to the second light emission region 10b by reflecting members (105 and 106) which reflect the light of the predetermined wavelength band arranged between the semiconductor device and the wavelength conversion element 104 to be emitted.

A separating distance between the first light emission region 10a and the second light emission region 10b of the laser light source 10 is determined by an arranging separation distance between the two reflecting members (105 and 106) for guiding the light converted by the wavelength conversion element 104 to the second light emission region 10b. The two reflecting members (105 and 106) needs to be arranged with a separation distance so that the two reflecting members are not brought into contact with each other. Even if the separation distance between the two reflecting members (105 and 106) may be reduced, it is necessary to prevent light from being incident on the wavelength conversion element 104 again. If the light converted by the wavelength conversion element 104 is incident on the wavelength conversion element 104 again, a part of the light is absorbed by the wavelength conversion element 104, and light intensity becomes lower than that of the light emitted as it is. Therefore, the first light emission region 10a and the second light emission region 10b need to be separated by a certain distance or more.

Due to the above-described circumstances, the external resonator type laser light source 10 includes the two light emission regions (10a and 10b) separated by a certain distance or more. Since the light emitting units 102 are formed in an array on the semiconductor device 101, a plurality of beams (light beams or bundle of rays) is emitted also from each of the two light emission regions (10a and 10b).

FIG. 2A is a YZ plane view schematically illustrating the light source device 100 including the laser light source 10, the condenser lens 110, and the fiber 111. FIG. 2A schematically illustrates a side view of a traveling path of light (laser light) emitted from the two different light emission regions (10a and 10b) of the laser light source 10. As illustrated in FIG. 2A, each laser beam emitted from the laser light source 10 is incident on the condenser lens 110. Each laser beam emitted from the condenser lens 110 is condensed toward an incident surface 111a of the fiber 111.

In FIG. 2A, an axis orthogonal to the incident surface 111a of the fiber 111 is made an optical axis 112. An optical axis 112 direction is made a Z direction, a plane orthogonal to the Z direction is made an XY plane, and an incident angle of light with respect to the incident surface 111a is made θ1. Further, in each of the light emission regions (10a and 10b), a direction in which the laser beams are aligned in accordance with the arrangement of the light emitting units 102 in an array is made an X direction, and a direction in which the light emission regions (10a and 10b) are opposed to each other is made a Y direction. In this specification, a light ray emitted from the center of each of the light emission regions (10a and 10b) in parallel with the optical axis 112 is referred to as a "principal light ray" and a light ray group formed into a laser beam emitted from each of the light emission regions (10a and 10b) is referred to as a "light bundle of rays".

Next, a case where the light source device 100 is seen in the Y direction is described. FIG. 2B is a schematic diagram of the light source device 100 illustrated in FIG. 2A as seen in the Y direction.

A plurality of light bundles of rays emitted from the laser light source 10 is emitted from the first light emission region 10a and the second light emission region 10b in a state of being aligned in a line to be incident on the condenser lens 110. A plurality of light bundles of rays emitted from the condenser lens 110 is condensed toward the incident surface 111a of the fiber 111. Note that a plurality of light bundles of rays emitted from the first light emission region 10a is emitted while forming a line similar to that of a plurality of light bundles of rays emitted from the second light emission region 10b, so that this is hidden by the plurality of light bundles of rays emitted from the second light emission region 10b as seen from above (FIG. 2B).

Furthermore, a case where the incident surface 110a of the condenser lens 110 is seen in the XY plane view is described. FIG. 2C is a schematic diagram when an incident surface 110a of the condenser lens 110 in FIG. 2A is seen from a laser light source 10 side in the Z direction. As illustrated in FIG. 2C, on the incident surface 110a of the condenser lens 110, a light bundle of rays L10a emitted from the first light emission region 10a and a light bundle of rays L10b emitted from the second light emission region 10b are incident in positions symmetrical in the Y direction across the optical axis 112. FIG. 2C illustrates a concentric circle connecting principal light ray of the light bundle of rays having the same distance from the optical axis 112 with the optical axis 112 at the center.

When each light bundle of rays (L10a and L10b) is incident on the incident surface 110a of the condenser lens 110 in this manner, as illustrated in FIG. 2C, a region with no light or with extremely low light intensity as compared to the vicinity of the principal light ray is generated near the optical axis 112.

On the incident surface 110a of the condenser lens 110, when the light in which a region with no light or with extremely low light intensity as compared to the vicinity of the principal light ray is generated around the optical axis 112 is condensed toward the incident surface 111a of the fiber 111 by the condenser lens 110, the light incident on the fiber 111 becomes the light in which the light is not present in a region at a small incident angle θ1 on the incident surface 111a of the fiber 111 or the light with the region in which the light intensity is extremely low as compared to the vicinity of the principal light ray. Angular distribution according to configurations illustrated in FIGS. 2A to 2C is to be described later in detail in the description of FIG. 3.

FIG. 3 is a graph schematically illustrating angular distribution of the light on the incident surface 111a of the fiber 111. In FIG. 3, the abscissa corresponds to the incident angle θ1 of light on the incident surface 111a, and the ordinate corresponds to the light intensity for each incident angle θ1. As illustrated in FIG. 3, in the region where the incident angle θ1 is small on the incident surface 111a of the fiber 111, a region in a part of which no light is present or with extremely low light intensity as compared to the vicinity of the principal light ray is generated.

The angular distribution of the light on the incident surface 111a of the fiber 111 is also maintained on the emission surface 111b. That is, also on the emission surface 111b of the fiber 111, a region in a part of which no light is present or with extremely low light intensity as compared to the vicinity of the principal light ray is present in the angular range in which the light is present, which causes uneven illumination. Therefore, it is understood that, when the laser light source including a plurality of emission regions is used, with the light source device configured as illustrated in FIGS. 2A to 2C, it is not possible to obtain the light with uniform angular distribution, resulting in uneven illuminance.

Herein, in view of the above-described problem, a method of shifting an incident position of the light bundle of rays on the incident surface 110a of the condenser lens 110 is conceivable. However, as described above, there is a limit in reducing the separating distance between the light emission regions (10a and 10b) of the laser light source 10. Therefore, when the light bundle of rays emitted from any one of the light emission regions (10a and 10b) is adjusted to be close to the optical axis 112, the light bundle of rays emitted from the other of the light emission regions (10a and 10b) is further away from the optical axis 112.

Therefore, even if the incident position of the light bundle of rays on the incident surface 110a of the condenser lens 110 is adjusted, a certain separating distance is required between the light emission regions (10a and 10b) of the laser light source 10, so that the region in a part of which the light is not present or with the extremely low light intensity as compared with the vicinity of the principal light ray is generated in the angular range in which the light is present, so that the illumination unevenness of the light emitted from the light source device 100 is not resolved.

In view of the above-described problems, an object of the present invention is to provide a light source device that emits light with improved uniformity of angular distribution using an external resonator type semiconductor laser light source that emits light from a plurality of emission regions.

A light source device according to the present invention is provided with:

an external resonator type semiconductor laser light source that includes a wavelength conversion element and emits light having a wavelength converted by the wavelength conversion element from a first light emission region and a second light emission region different from the first light emission region;

a first optical waveguide and a second optical waveguide that each include an incident surface having a circular shape and emit light from light emission surfaces to a same irradiation surface;

a first condensing optical system that condenses a plurality of first light bundles of rays emitted from the first light emission region on the incident surface of the first optical waveguide; and a second condensing optical system that condenses a plurality of second light bundles of rays emitted from the second light emission region on the incident surface of the second optical waveguide.

The plurality of first light bundles of rays emitted from the first light emission region of the laser light source is incident on the incident surface of the first condensing optical system and a plurality of second light bundles of rays emitted from the second light emission region of the laser light source is incident on the incident surface of the second condensing optical system. With such a configuration, the plurality of first light bundles of rays may be incident on an arbitrary position on the incident surface of the first condensing optical system, and the plurality of second light bundles of rays may be incident on an arbitrary position on the incident surface of the second condensing optical system.

The optical waveguide uniformizes distribution in a circumferential direction around the optical axis while maintaining an angle of an incident angle with respect to the optical axis, thereby emitting the light incident from the incident surface at the same angle as the incident angle from the emission surface. This is to be described later in detail in the description of FIG. 5B.

By allowing the light bundle of rays to be incident on an arbitrary position of the condensing optical system, it is possible to adjust the distribution of the incident angle with respect to the incident surface of the optical waveguide. Therefore, by adjusting the angular distribution of the light emitted from the optical waveguide, the uniformity of the angular distribution is improved, and the light in which illuminance unevenness is suppressed may be obtained.

In the light source device described above, a separation distance d1$a$ between a principal light ray of a first specific light bundle of rays incident in a position closest to an optical axis of the first condensing optical system out of the plurality of first light bundles of rays incident on an incident surface of the first condensing optical system and the optical axis of the first condensing optical system may be shorter than a separation distance d1$b$ between the principal light ray of the first specific light bundle of rays and a principal light ray of a first light bundle of rays adjacent to the first specific light bundle of rays, and a separation distance d2$a$ between a principal light ray of a second specific light bundle of rays incident in a position closest to an optical axis of the second condensing optical system out of the plurality of second light bundles of rays incident on an incident surface of the second condensing optical system and the optical axis of the second condensing optical system may be shorter than a separation distance d2$b$ between the principal light ray of the second specific light bundle of rays and a principal light ray of a second light bundle of rays adjacent to the second specific light bundle of rays.

The light bundle of rays is incident in a region near the optical axis on the incident surface of the condensing optical system, so that the light of a region with a small incident angle on the incident surface of the optical waveguide may be obtained. With the above-described configuration, both the plurality of first light bundles of rays on the incident surface of the first condensing optical system and the plurality of second light bundles of rays on the incident surface of the second condensing optical system may allow the light bundle of rays to be incident in the region close to the optical axis of the condensing optical system.

By making the separation distance (d1$a$, d2$a$) of the principal light ray of the specific light bundle of rays incident in a position the closest to the optical axis of the condensing optical system out of a plurality of light bundles of rays incident on the incident surface of the condensing optical system and the optical axis of the condensing optical system shorter than the separation distance (d1$b$, d2$b$) between the principal light ray of the specific light bundle of rays and the principal light ray of the light bundle of rays adjacent to the specific light bundle of rays, the light at a small incident angle may be allowed to be incident on the incident surface of the optical waveguide. Light in a region where the incident angle on the incident surface of the optical waveguide is small may be obtained, so that uniformity of the angular distribution may be further improved and light with suppressed illuminance unevenness may be obtained.

In the light source device described above, a difference between the separation distance d1$a$ and the separation distance d2$a$ may be not smaller than ¼ and not larger than ½ of the separation distance d1$b$ or the separation distance d2$b$.

Since the difference between the separation distance d1$a$ and the separation distance d2$a$ is made not smaller than ¼ and not larger than ½ of the separation distance d1$b$ or the separation distance d2$b$, in an angular range in which light of angular distribution of the light emitted from the first optical waveguide and light of angular distribution of the light emitted from the second optical waveguide are present, it is possible to complement regions in a part of which the light is not present or with extremely low light intensity as compared to the vicinity of a principal light ray with each other, so that the uniformity of the angular distribution is further improved and light in which illuminance unevenness is suppressed may be obtained.

In the light source device described above, the first condensing optical system may include a first lens portion on which a part of the plurality of first light bundles of rays is incident to be condensed in a first condensing region on the incident surface of the first optical waveguide, and a second lens portion on which another part of the plurality of first light beams is incident to be condensed in a second condensing region different from the first condensing region on the incident surface of the first optical waveguide, and a principal light ray of a light bundle of rays located at center of the plurality of first light bundles of rays may be located between an optical axis of the first lens portion and an optical axis of the second lens portion on the incident surface of the first condensing optical system.

Furthermore, in the light source device described above, the second condensing optical system may include a third lens portion on which a part of the plurality of second light bundles of rays is incident to be condensed in a third condensing region on the incident surface of the second optical waveguide, and a fourth lens portion on which another part of the plurality of second light bundles of rays is incident to be condensed in a fourth condensing region different from the third condensing region on the incident surface of the second optical waveguide, and a principal light ray of a light bundle of rays located at center of the plurality of second light bundles of rays may be located between an optical axis of the third lens portion and an optical axis of the fourth lens portion on the incident surface of the second condensing optical system.

The semiconductor laser light source includes a semiconductor device (semiconductor laser device) which emits light. This semiconductor device generates heat due to internal resistance when a current is applied for light emission. That is, in a case where a plurality of semiconductor devices is arranged so as to emit a plurality of light bundles of rays, the semiconductor device arranged in the center is also affected by the heat of surrounding semiconductor devices, so that temperature thereof becomes higher than that of the semiconductor device arranged on an end.

As the temperature of the semiconductor device increases, an amount of current required for light emission (threshold current) increases, so that when a plurality of semiconductor devices is driven at a constant current value, there is a case where the semiconductor at the center the temperature of which becomes high is not lit or light intensity thereof is lowered. This is to be described later in detail in the description of FIG. 10.

Therefore, when the current is applied to the semiconductor device to light the same, and the temperature of the semiconductor device becomes high after a while, there is a case where the semiconductor device at the center is not lit and the light bundle of rays located at the center out of the plurality of light bundles of rays emitted from the first light emission region and the second light emission region of the semiconductor laser light source is not emitted.

With the configuration described above, even if some of the light bundle of rays are extinguished due to heat generation, it is possible to complement a region in a part of which the light is not present or with extremely low light intensity as compared to the vicinity of the principal light ray in an angular range in which the light is present by another light bundle of rays. Therefore, in a case where the temperature of the laser light source rises and the light intensity of the light bundle of rays located at the center out of a plurality of light bundles of rays emitted from the light emission regions decreases, it is possible to avoid significant decrease in the uniformity of the angular distribution of the light emitted from the light source device.

In the light source device described above, the first condensing optical system and the second condensing optical system may be combined to be integrated.

In the light source device described above, the external resonator type semiconductor laser light source may be provided with:

a semiconductor device that emits basic light;

a wavelength selection element that is arranged in a position farther than the wavelength conversion element as seen from the semiconductor device, forms an external resonator of the basic light together with the semiconductor device, and transmits conversion light obtained by converting a wavelength of the basic light by the wavelength conversion element to guide to the first light emission region, and a reflecting member which reflects the conversion light emitted from the wavelength conversion element in a direction of the semiconductor device and guides to the second light emission region.

In the external resonator type semiconductor laser light source described above, the semiconductor device may include a plurality of light emitting units arranged in an array, and each of the plurality of light emitting units may emit the basic light.

Since the plurality of light emitting units is formed in an array in the semiconductor device, the light bundle of rays emitted from the first light emission region and the second light emission region of the external resonator type semiconductor laser light source are incident on the incident surface of the condensing optical system in an array at a predetermined separation distance. Therefore, it is possible to easily adjust the angular distribution according to the incident position.

According to the present invention, the light source device which emits the light in which uniformity of the angular distribution is improved by using the external resonator type semiconductor laser light source which emits light from a plurality of light emission regions may be provided.

DETAILED DESCRIPTION OF THE PREFERRED EMBODIMENTS

Figure 1A:
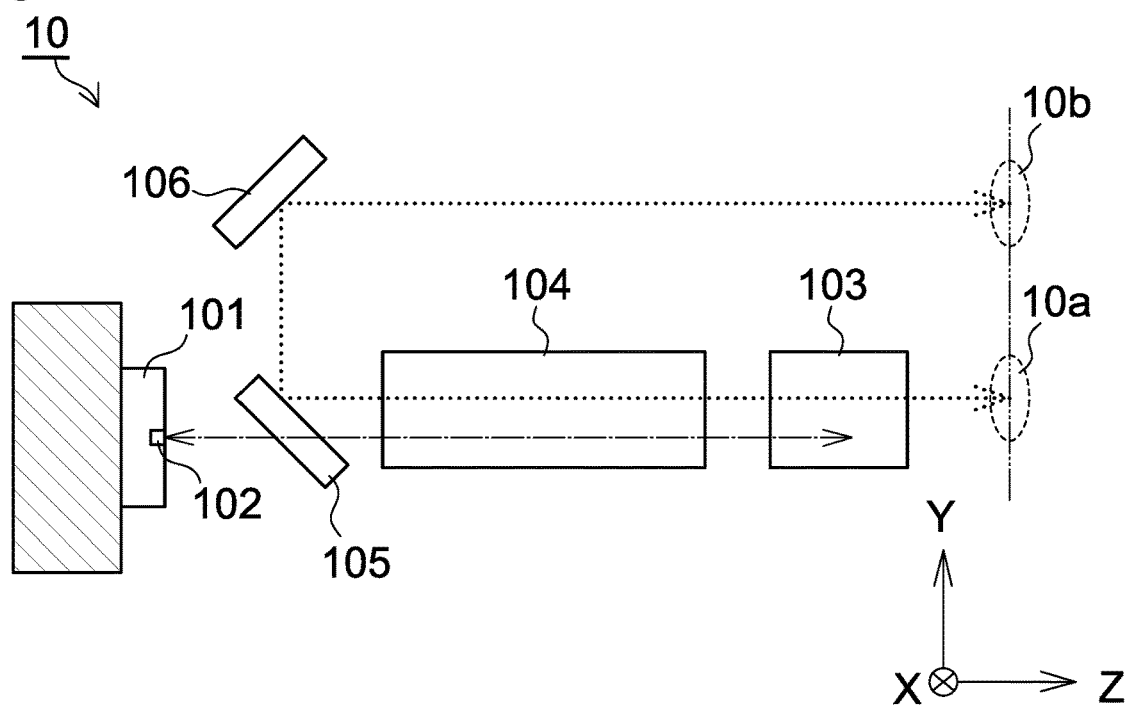
FIG. 1A is a side view schematically illustrating one embodiment of an external resonator type semiconductor laser light source.

A light source device of the present invention is hereinafter described with reference to the drawings. Note that, each of the following drawings is schematically illustrated, and a dimensional ratio and the number on the drawing do not necessarily coincide with the actual dimensional ratio and number.

First Embodiment

Figure 4A:
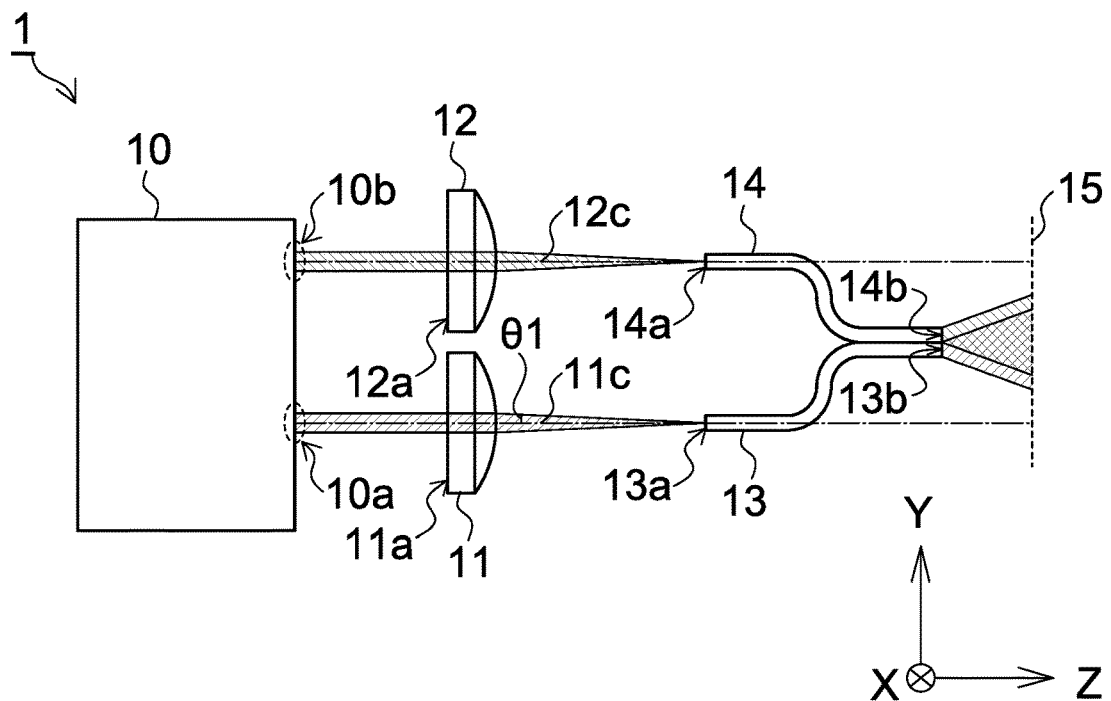
FIG. 4A is a YZ plane view schematically illustrating a configuration example of one embodiment of the light source device.

FIG. 4A is a view schematically illustrating a configuration example of one embodiment of a light source device 1. As illustrated in FIG. 4A, the light source device 1 is provided with a laser light source 10 including a first light emission region 10a and a second light emission region 10b, a first condensing optical system 11, a second condensing optical system 12, a first optical waveguide 13, and a second optical waveguide 14.

The first condensing optical system 11 is an optical system which condenses a plurality of light bundles of rays (hereinafter referred to as "first light bundle of rays") emitted from the first light emission region 10a on an incident surface 13a of the first optical waveguide 13. The second condensing optical system 12 is an optical system which condenses a plurality of light bundles of rays (hereinafter referred to as "second light bundle of rays") emitted from the second light emission region 10b on an incident surface 14a of the second optical waveguide 14.

The first optical waveguide 13 is a light guide member including a circular incident surface 13a which guides the light incident on the incident surface 13a from the first condensing optical system 11 to the light emission surface 13b and then emits the same to an irradiation surface 15. The second optical waveguide 14 is a light guide member including a circular incident surface 14a which guides the light incident from the second condensing optical system 12 to the light emission surface 14b and then emits the same to the irradiation surface 15. That is, the optical waveguides (13 and 14) are configured to emit the light from the light emission surfaces (13b and 14b), respectively, to the same irradiation surface 15.

In the following description, axes orthogonal to the incident surfaces (13a and 14a) of the first optical waveguide 13 and the second optical waveguide 14 are referred to as optical axes (11c and 12c), respectively. A direction of the optical axes (11c and 12c) is made a Z direction, a plane orthogonal to the Z direction is made an XY plane, and an incident angle of the light with respect to the incident surface 13a is made θ1. Furthermore, in each of the emission regions (10a and 10b), a direction in which the light bundle of rays are aligned is made an X direction, and a direction in which the emission regions (10a and 10b) are opposed to each other is made a Y direction.

Figure 4B:
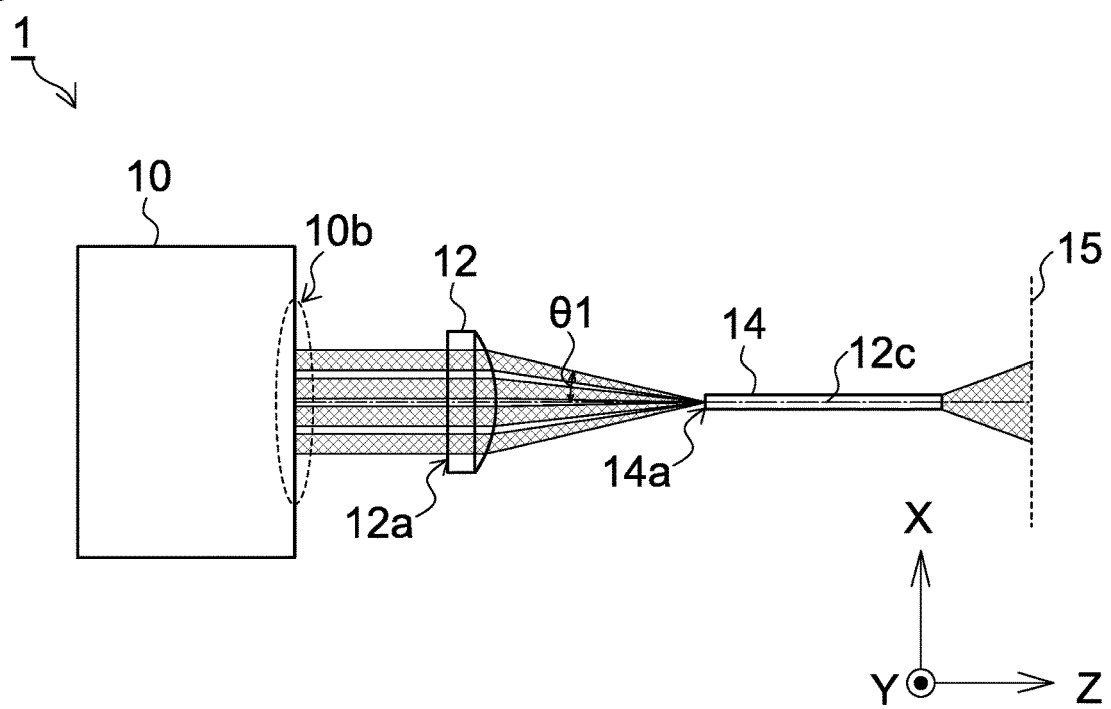
FIG. 4B is a schematic diagram of the light source device in FIG. 4A as seen in a Y direction.

FIG. 4B is a schematic diagram of the light source device 1 illustrated in FIG. 4A as seen in the Y direction. As illustrated in FIG. 4B, the plurality of second light bundles of rays emitted from the laser light source 10 is emitted from the second light emission region 10b in a state of being aligned in a line to be incident on the second condensing optical system 12. The plurality of light bundles of rays emitted from the second condensing optical system 12 is condensed toward the incident surface 14a of the second optical waveguide 14.

Figure 2A:
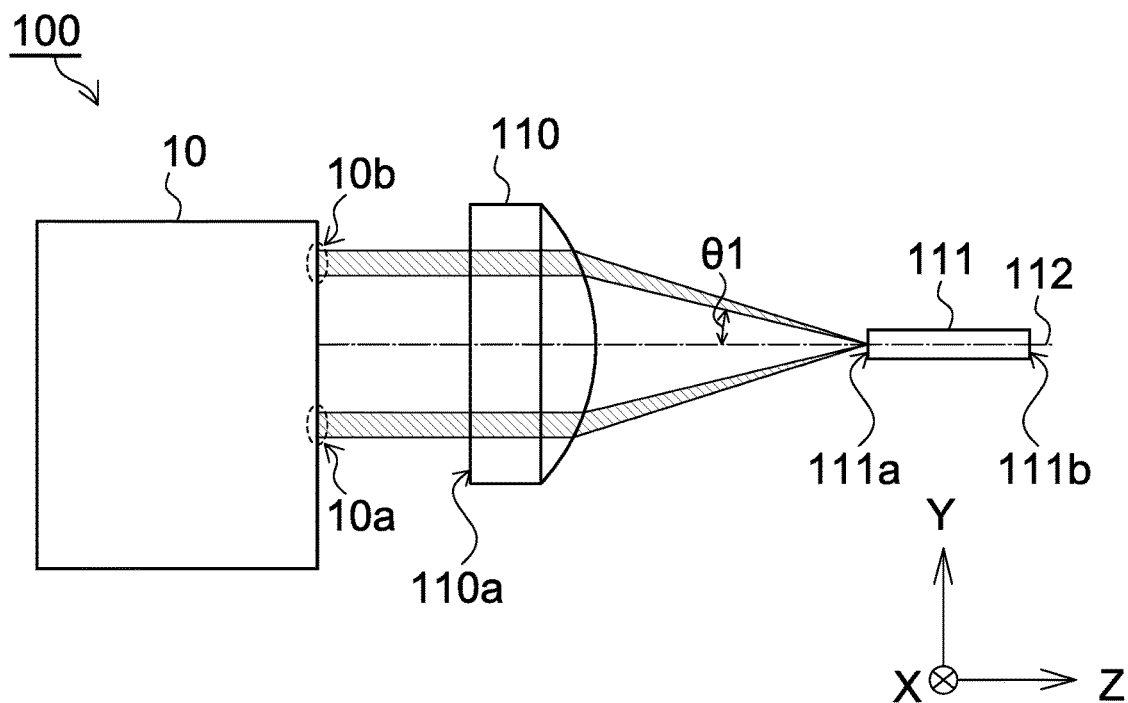
FIG. 2A is a YZ plane view schematically illustrating a light source device including the laser light source, a condenser lens, and a fiber.
Figure 2B:
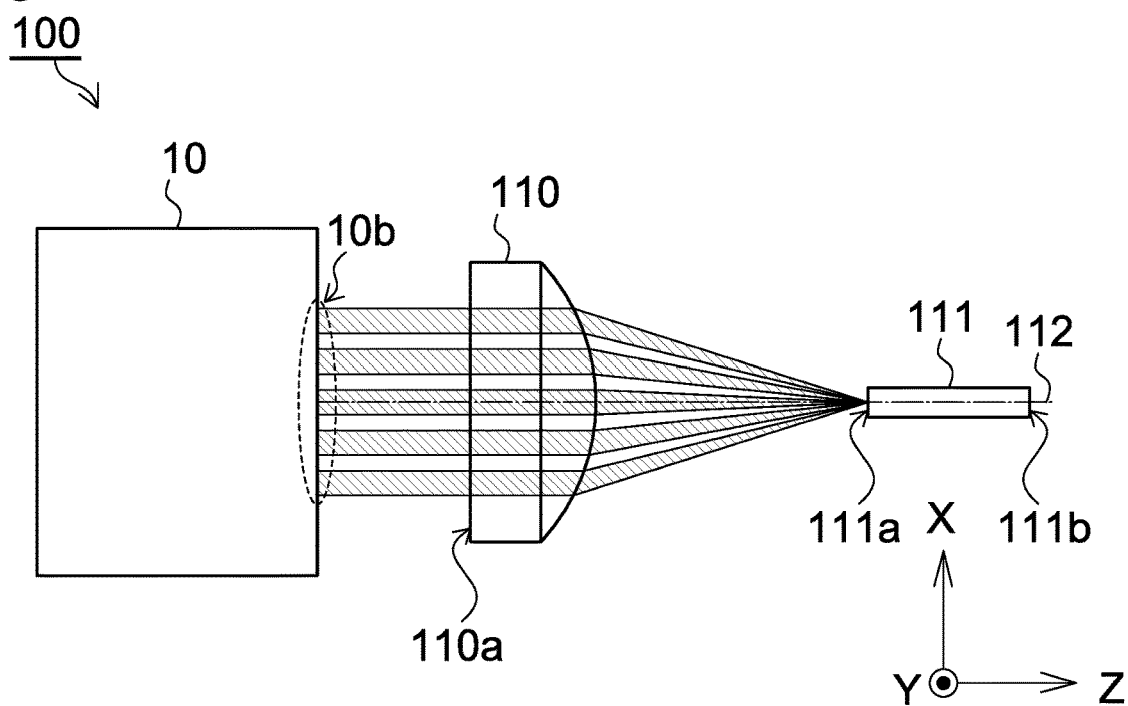
FIG. 2B is a schematic diagram of the light source device in FIG. 2A as seen in a Y direction.
Figure 2C:
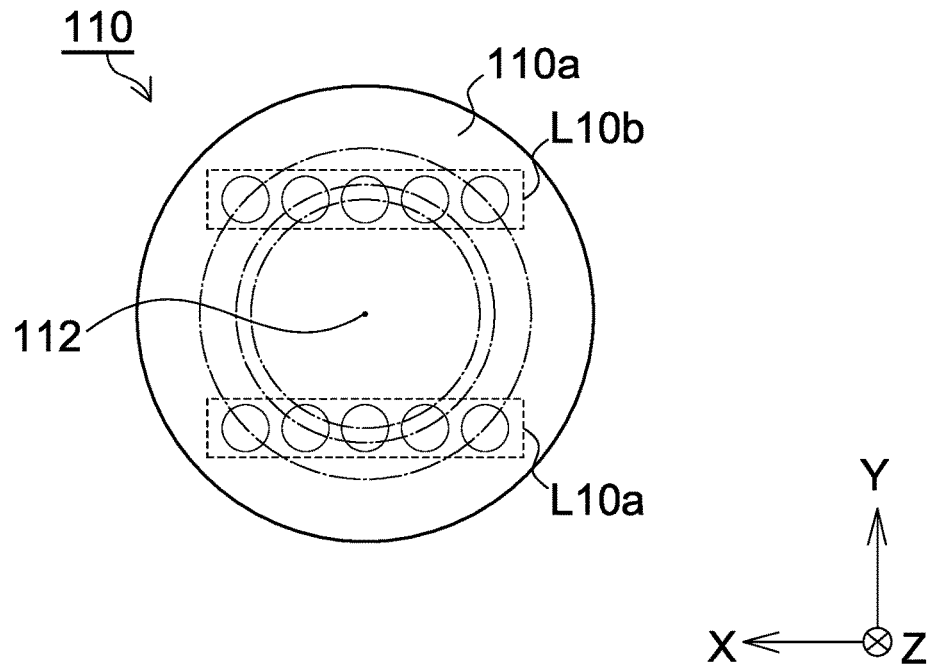
FIG. 2C is a schematic diagram when an incident surface of the condenser lens in FIG. 2A is seen from a laser light source side in a Z direction.
Figure 3:
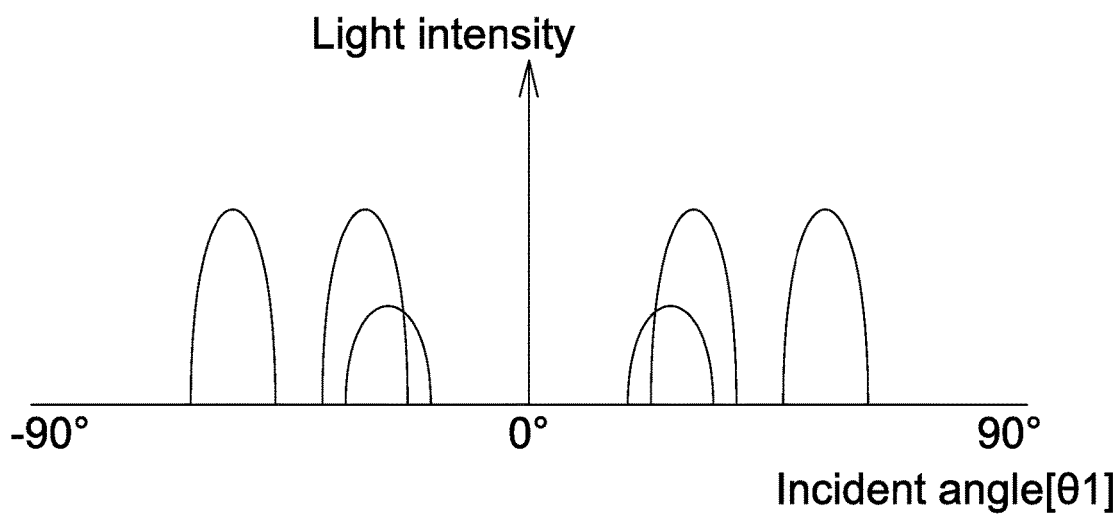
FIG. 3 is a graph schematically illustrating angular distribution of light on an incident surface of the fiber.

Note that, as in FIG. 2B, the plurality of first light bundles of rays emitted from the first light emission region 10a is emitted while forming a line similar to that of the plurality of second light bundles of rays emitted from the second light emission region 10b, so that this is hidden by the plurality of second light bundles of rays emitted from the second light emission region 10b as seen from above. The first condensing optical system 11 and the first optical waveguide 13 are hidden by the second condensing optical system 12 and the second optical waveguide 14, respectively.

In the first embodiment, the laser light source 10 is an external resonator type semiconductor laser light source. As an example, a structure common to that of the conventional laser light source 10 described above with reference to FIG. 1A may be employed. That is, as illustrated in FIG. 1A, the laser light source 10 is provided with a semiconductor device 101 that emits basic light, a VBG 103 that is arranged in a position farther than a wavelength conversion element 104 as seen from the semiconductor device 101, form an external resonator of the basic light together with the semiconductor device 101, and transmits conversion light obtained by converting a wavelength of the basic light by the wavelength conversion element 104 to guide to the first light emission region 10a, and reflecting members (105 and 106) which reflect the conversion light emitted from the wavelength conversion element 104 in a direction of the semiconductor device 101 to guide to the second light emission region 10b.

The first condensing optical system 11 and the second condensing optical system 12 are arranged such that the light bundle of rays emitted from the laser light source 10 is incident on a flat surface thereof and emitted from a convex surface thereof; however, they may also be arranged such that the light bundle of rays emitted from the laser light source 10 is incident on the convex surface and emitted from the flat surface.

Figure 4C:
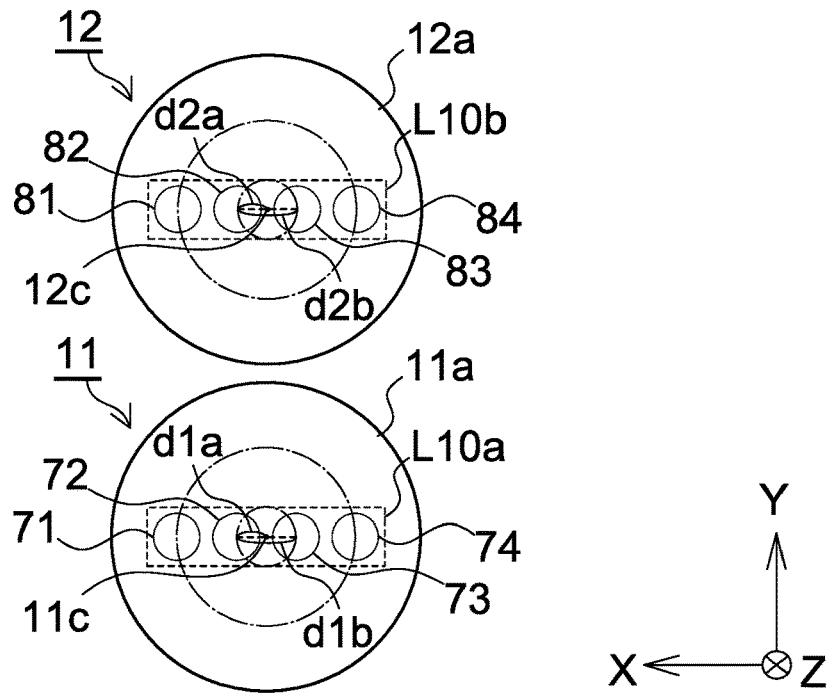
FIG. 4C is a schematic diagram when an incident surface of a condensing optical system in FIG. 4A is seen from the laser light source side in a Z direction.

FIG. 4C is a schematic diagram when incident surfaces (11a and 12a) of the condensing optical systems (11 and 12) in FIG. 4A are seen from the laser light source 10 side in the Z direction. As illustrated in FIG. 4C, in the first embodiment, a relative incident position with respect to the center on the incident surface 11a of first light bundle of rays L10a incident on the first condensing optical system 11 and a relative incident position with respect to the center on the incident surface 12a of a second light bundle of rays L10b incident on the second condensing optical system 12 are the same.

Note that, in an example in FIG. 4C, principal light rays of the light bundle of rays incident on each of the incident surfaces (11a and 12a) of the condensing optical systems (11 and 12) are arranged so as to be aligned on a straight line such that a midpoint of the straight line connecting the principal light rays of the light bundle of rays is located on the optical axis (11c and 12c) of the condensing optical system (11 and 12).

FIG. 4C also illustrates concentric circles connecting the principal light rays of the light bundle of rays having the same distance from the optical axis (11, 12) with the optical axis (11, 12) at the center. Hereinafter, the same applies to the drawings illustrating the incident surface of the condensing optical system.

Herein, out of the plurality of first light bundles of rays incident on the incident surface 11a of the first condensing optical system 11, the light bundle of rays incident in a position the closest to the optical axis 11c of the first condensing optical system 11 is referred to as a "first specific light ray". FIG. 4C illustrates a case where four light bundles of rays (71, 72, 73, and 74) are included as an example of the plurality of first light bundles of rays L10a incident on the incident surface 11a. In this example, the light bundle of rays 72 or the light bundle of rays 73 corresponds to the first specific light bundle of rays. Herein, the light bundle of rays 72 is handled as the first specific light bundle of rays.

A separation distance between the principal light ray of the first specific light bundle of rays 72 and the optical axis 11c of the first condensing optical system 11 is a separation distance d1a. A separation distance between the principal light ray of the first specific light bundle of rays 72 and the principal light ray of the first light bundle of rays adjacent to the first specific light bundle of rays (herein, the light bundle of rays 71 and the light bundle of rays 73 correspond thereto) is a separation distance d1b.

Similarly for the second condensing optical system 12, out of the plurality of second light bundles of rays incident on the incident surface 12a of the second condensing optical system 12, the light bundle of rays incident on a position the closest to the optical axis 12c of the second condensing optical system 12 is referred to as a "second specific light bundle of rays". FIG. 4C illustrates a case where four light bundle of rays (81, 82, 83, and 84) are included as an example of the plurality of second light bundles of rays L10b incident on the incident surface 12a. In this example, the light bundle of rays 82 or the light bundle of rays 83 corresponds to the second specific light bundle of rays. Herein, the light bundle of rays 82 is handled as the second specific light bundle of rays.

A separation distance between the principal light ray of the second specific light bundle of rays 82 and the optical axis 12c of the second condensing optical system 12 is made a separation distance d2a. A separation distance between the principal light ray of the second specific light bundle of rays 82 and the principal light ray of the second light bundle of rays adjacent to the second specific light bundle of rays (herein, the light bundle of rays 81 and the light bundle of rays 83 correspond thereto) is made a separation distance d2b.

On the incident surfaces (11a and 12a) of the condensing optical systems (11 and 12), respectively, the light bundle of rays (L10a and L10b) are arranged as illustrated in FIG. 4C, so that the separation distance d1a is shorter than the separation distance d1b, and the separation distance d2a is shorter than the separation distance d2b. Since the separation distance d1a is shorter than the separation distance d1b and the separation distance d2a is shorter than the separation distance d2b, the light emitted from the first light emission region 10a and the second light emission region 10b to be incident on the incident surfaces (13a and 14a) of the optical waveguides (13 and 14) is distributed at a small incident angle θ1.

Figure 5A:
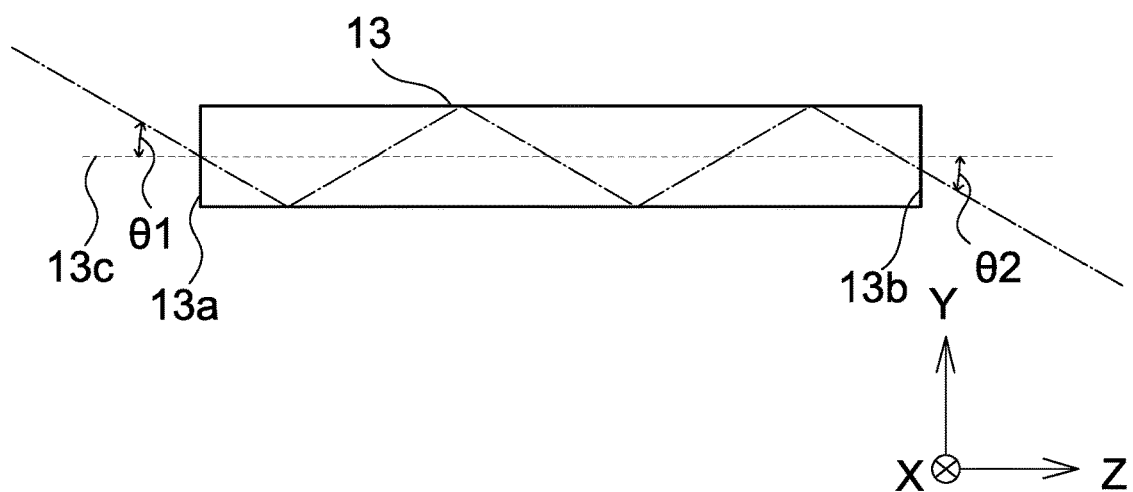
FIG. 5A is a view schematically illustrating light traveling in a first optical waveguide in the YZ plane view.

Herein, it is described how the light bundle of rays incident on the first optical waveguide 13 is converted to be emitted. FIG. 5A is a view schematically illustrating light traveling in the first optical waveguide 13 in a YZ plane view. As illustrated in FIG. 5A, the first optical waveguide 13 guides the light ray to the emission surface 13b while repeatedly reflecting the incident light on a side surface thereof.

In FIG. 5A, only one light ray is schematically illustrated, but a plurality of light bundles of rays is incident on the first optical waveguide 13, and the light rays are collected in the first optical waveguide 13 to be emitted from the emission surface 13b.

Figure 5B:
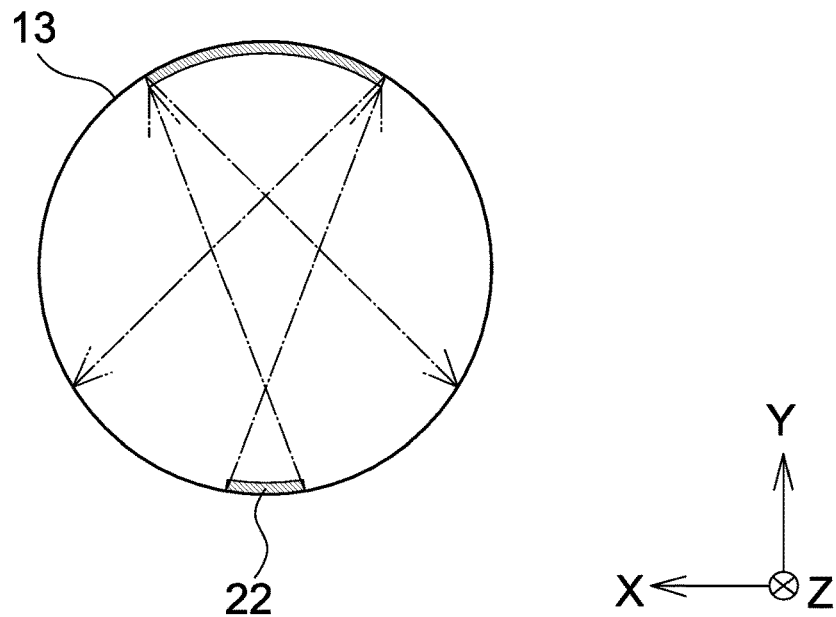
FIG. 5B is a view schematically illustrating the light traveling in the first optical waveguide in an XY plane view.

Next, a case where the light traveling in the optical waveguide (13, 14) is seen on an XY plane is described. FIG. 5B is a view schematically illustrating the light traveling in the first optical waveguide 13 in a XY plane view. As illustrated in FIG. 5B, a light bundle of rays 22 incident on the first optical waveguide 13 is reflected on an inner wall surface of the first optical waveguide 13 which is circular. Herein, when the light bundle of rays 22 having a certain width is reflected on the circular inner wall surface of the first optical waveguide 13, this travels while extending in width toward an opposite wall surface.

Figure 5C:
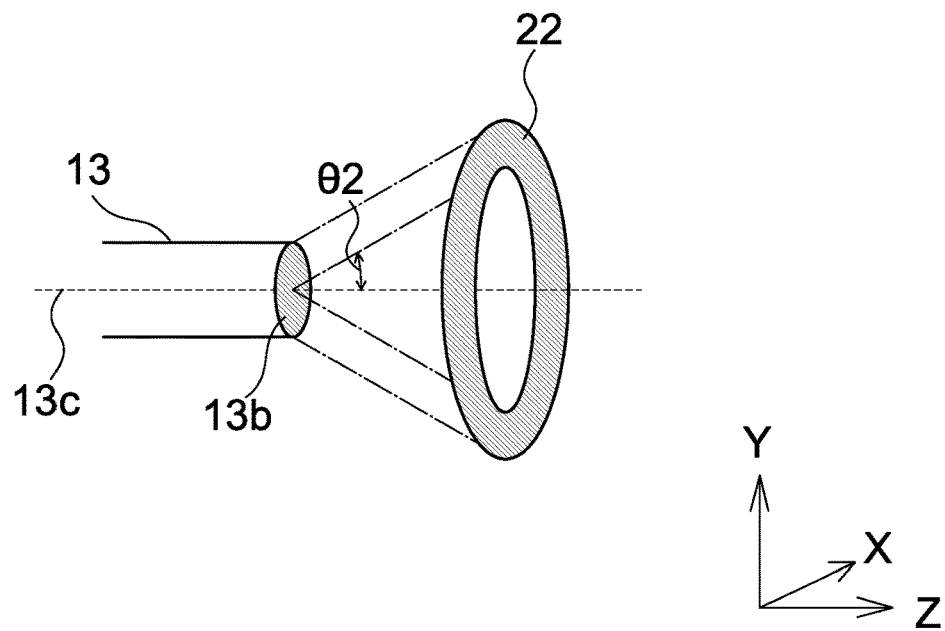
FIG. 5C is a view schematically illustrating the light emitted from the first optical waveguide.

FIG. 5C is a view schematically illustrating the light emitted from the first optical waveguide 13. As described above, the light bundle of rays 22 incident on the first optical waveguide 13 from the incident surface 13a travels while being repeatedly reflected on the inner wall surface of the first optical waveguide 13, and eventually becomes the light bundle of rays 22 traveling while being reflected in an entire circumferential direction of the inner wall surface of the first optical waveguide 13.

The light bundle of rays which reaches the emission surface 13b is emitted as the light bundle of rays 22 in an annular shape at an emission angle θ2 around an optical axis 13c. In the first embodiment, the first optical waveguide 13 is bent between the incident surface 13a and the emission surface 13b; however, since the incident angle θ1 of the light is maintained until reaching the emission surface 13b, this is emitted from the emission surface 13b at the emission angle θ2 as in the configuration illustrated in FIG. 5C.

In order to prevent illuminance unevenness of the light emitted from the first optical waveguide 13, the light source and the optical system must be arranged such that a region in which no light is present or with extremely low light intensity as compared to the vicinity of the principal light ray is not present on the concentric circle around the optical axis 11c of the first condensing optical system 11 on the incident surface 11a of the first condensing optical system 11 as described above. Note that, since the light bundle of rays incident on the second optical waveguide 14 is also converted in the same manner as that of the light bundle of rays 22 incident on the first optical waveguide 13, the description thereof is omitted.

The light emitted from the first optical waveguide 13 and the light emitted from the second optical waveguide 14 are emitted toward the same irradiation surface 15 as described above. Herein, since angular distribution with respect to the incident angle θ1 on each of the incident surfaces (13a and 14a) of the optical waveguides (13 and 14) is maintained, angular distribution of the light emitted from each of the emission surfaces (13b and 14b) of the first optical waveguide 13 and the second optical waveguide 14 to be applied to the irradiation surface 15 is obtained by adding the angular distribution with respect to the incident angle θ1 of the light incident on the first optical waveguide 13 and that incident on the second optical waveguide 14.

Figure 6:
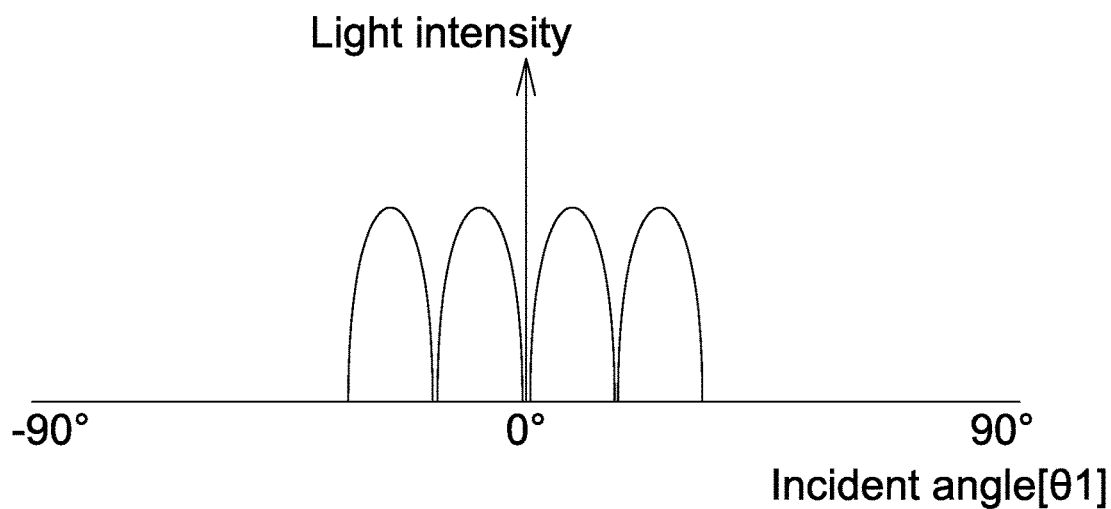
FIG. 6 is a graph schematically illustrating angular distribution of light emitted from the light source device in FIG. 4A.

FIG. 6 is a graph schematically illustrating the angular distribution of the light emitted from the light source device 1 in FIG. 4A. As illustrated in FIG. 6, the light source device 1 is configured as in the first embodiment, so that the light is distributed even at the small incident angle θ1 on the incident surfaces (13a and 14a) of the optical waveguides (13 and 14), and uniformity of the angular distribution is improved. That is, the light with suppressed illuminance unevenness may be emitted.

Second Embodiment

A configuration of a second embodiment of a light source device of the present invention is described mainly for a portion different from that of the first embodiment.

Figure 7A:
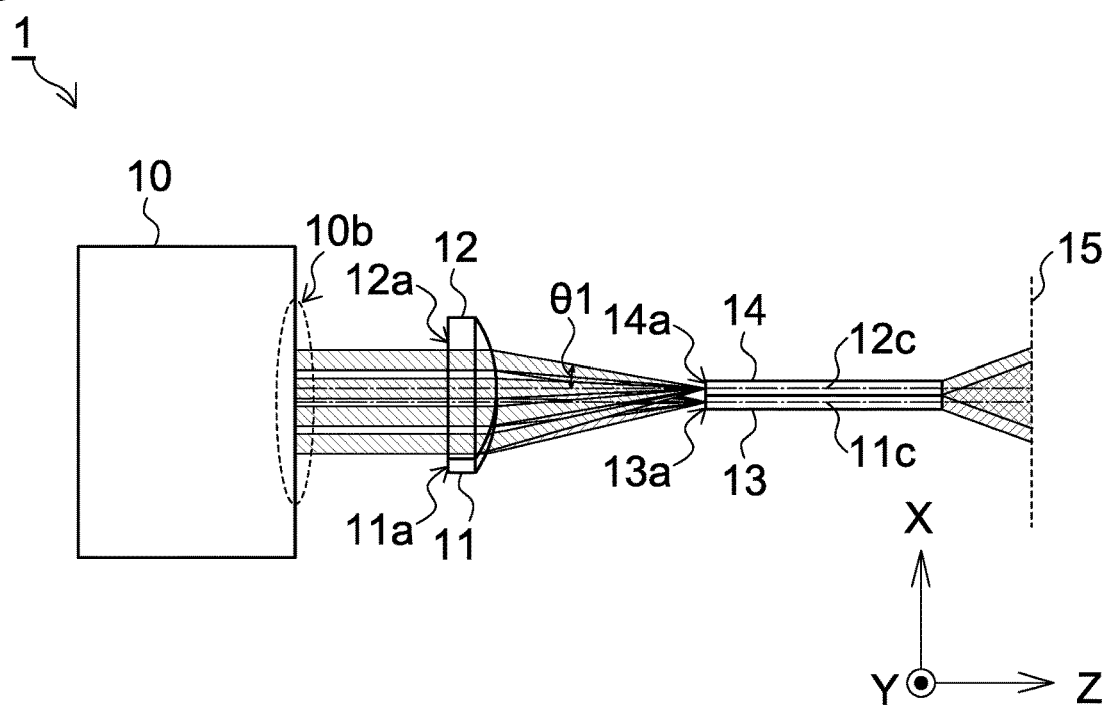
FIG. 7A is an XZ plane view schematically illustrating a configuration example of another embodiment of a light source device.
Figure 7B:
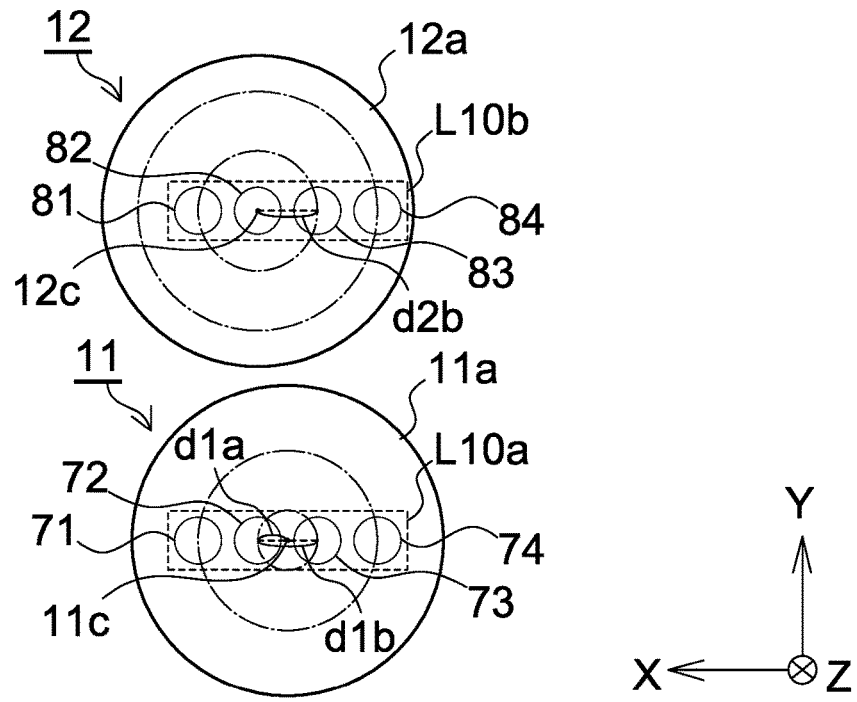
FIG. 7B is a schematic diagram when an incident surface of a condensing optical system in FIG. 7A is seen from a laser light source side in a Z direction.

FIG. 7A is an XZ plane view schematically illustrating a configuration example of another embodiment of a light source device 1. FIG. 7B is a schematic diagram when incident surfaces (11a and 12a) of condensing optical systems (11 and 12) in FIG. 7A are seen from a laser light source 10 side in a Z direction. As illustrated in FIGS. 7A and 7B, in the second embodiment, a first condensing optical system 11 is arranged such that a separation distance d1a is ½ of a separation distance d1b, and a second condensing optical system 12 is arranged such that a separation distance d2a is 0, that is, a principal light ray of a second specific light bundle of rays 82 coincides with an optical axis 12c of the second condensing optical system 12. Note that, in FIG. 7B, the separation distance d2a is 0 and is not illustrated.

As described above, angular distribution of light emitted by the light source device 1 is obtained by adding angular distribution of light emitted from a first optical waveguide 13 and angular distribution of light emitted from a second optical waveguide 14, the angular distribution with respect to an incident angle θ1 of light incident on the first optical waveguide 13 and the second optical waveguide 14.

Figure 8:
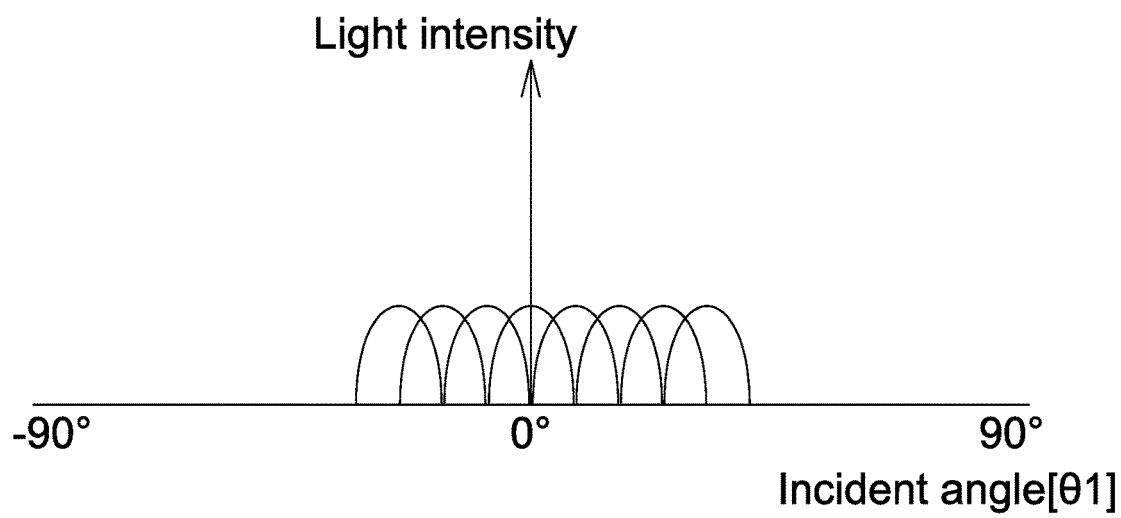
FIG. 8 is a graph schematically illustrating angular distribution of light emitted from the light source device in FIG. 7A.

FIG. 8 is a graph schematically illustrating the angular distribution of the light emitted from the light source device 1 in FIG. 7A. As illustrated in FIG. 8, the angular distribution of the light emitted from the light source device 1 complements regions in a part of which the light is not present or with extremely low light intensity as compared to the vicinity of a principal light ray with each other, so that uniformity of the angular distribution is improved and light in which illuminance unevenness is suppressed may be emitted.

In the second embodiment, the first condensing optical system 11 is arranged such that the separation distance d1$a$ is ½ of the separation distance d1$b$, and the second condensing optical system 12 is arranged such that the separation distance d2$a$ is 0; however, it is also possible that the first condensing optical system 11 is arranged such that the separation distance d1$a$ is ¼ of the separation distance d1$b$, and the second condensing optical system 12 is arranged such that the separation distance d2$a$ is 0. In addition, it does not matter if one of the separation distances (d1$a$ and d2$a$) is not 0, and it is sufficient that a difference between the separation distance d1$a$ and the separation distance d2$a$ is ¼ or larger and ½ or smaller of the separation distance d1$b$ or the separation distance d2$b$.

Third Embodiment

A configuration of a third embodiment of a light source device of the present invention is described mainly for a portion different from that of the first and second embodiments.

Figure 9A:
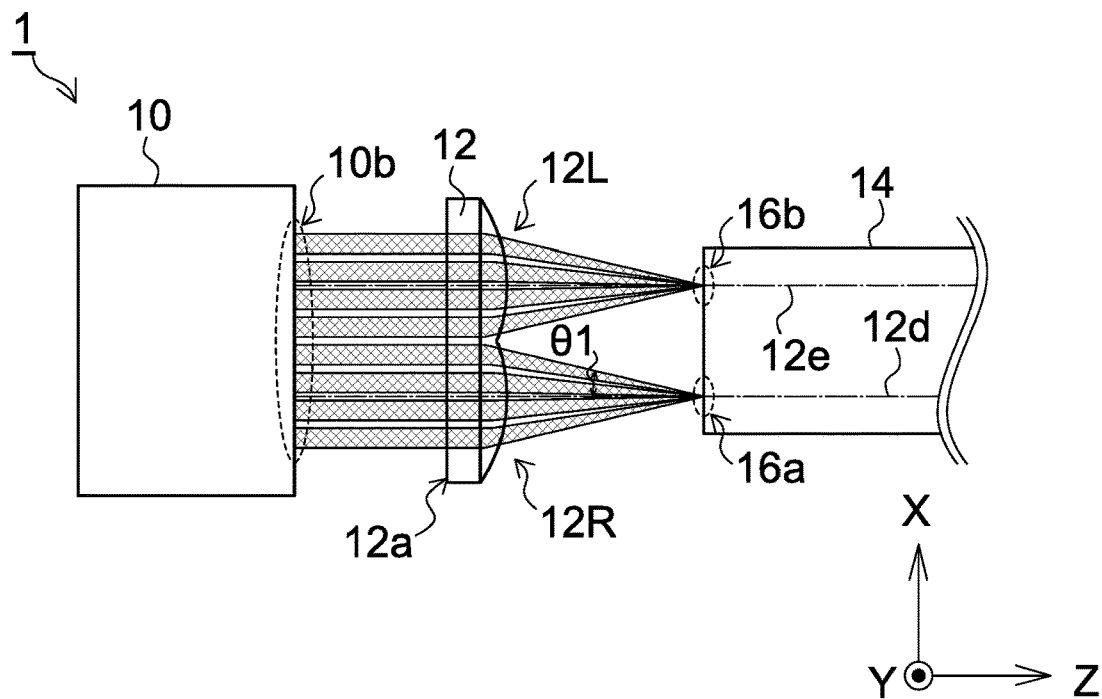
FIG. 9A is an XZ plane view schematically illustrating a configuration example of another embodiment of a light source device.
Figure 9B:
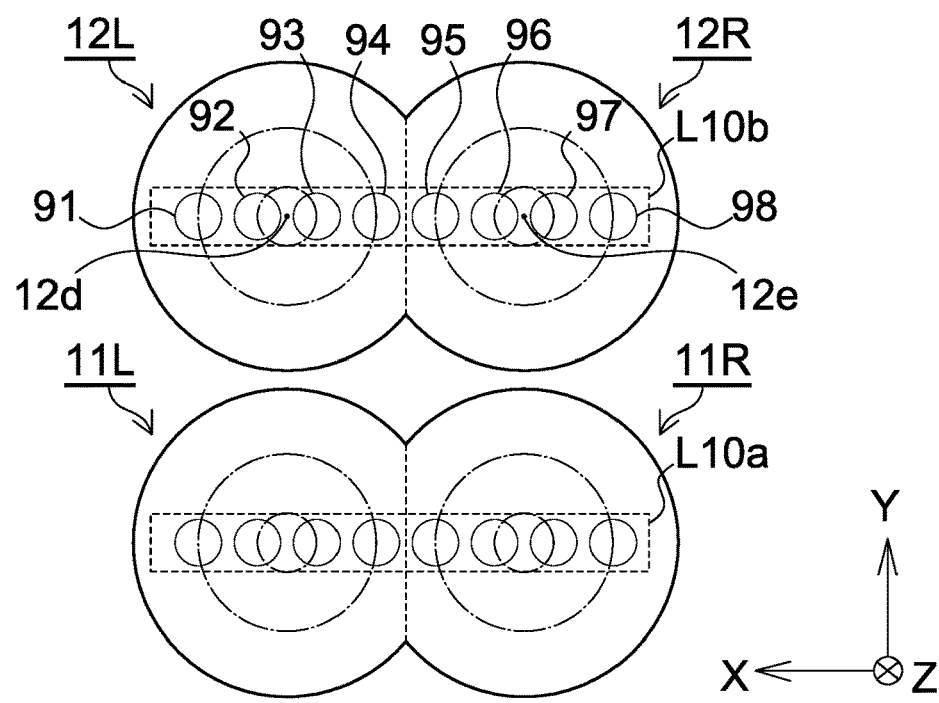
FIG. 9B is a schematic diagram when an incident surface of a condensing optical system in FIG. 9A is seen from a laser light source side in a Z direction.

FIG. 9A is an XZ plane view schematically illustrating a configuration example of another embodiment of a light source device 1. FIG. 9B is a schematic diagram when an incident surface 12$a$ of a condensing optical system 12 in FIG. 9A is seen from a laser light source 10 side in a Z direction. As illustrated in FIG. 9A and FIG. 9B, in the third embodiment, a first condensing optical system 11 includes a first lens portion 11L which condenses on a first condensing region 16$a$ on an incident surface 13$a$ of a first optical waveguide 13 and a second lens portion 11R which condenses on a second condensing region 16$b$ different from the first condensing region 16$a$. A second condensing optical system 12 includes a third lens portion 12L which condenses on a first condensing region 16$a$ on an incident surface 14$a$ of a second optical waveguide 14 and a fourth lens portion 12R which condenses on a second condensing region 16$b$ different from the first condensing region 16$a$.

For example, the second optical waveguide 14 may be a fiber bundle having the first condensing region 16$a$ as one incident surface and the second condensing region 16$b$ as another incident surface. The same applies to the first optical waveguide 13.

In the third embodiment, the first condensing optical system 11 and the second condensing optical system 12 have the same configuration, and a plurality of first light bundles of rays emitted from a first light emission region 10$a$ and a plurality of second light bundles of rays emitted from a second light emission region 10$b$ are incident on incident surfaces (11$a$ and 12$a$), respectively, in the same manner. Hereinafter, only conversion of a second light bundle of rays L10$b$ emitted from the second light emission region 10$b$ is described with reference to FIGS. 9A and 9B.

In the third embodiment, as illustrated in FIG. 9B, as an example of a plurality of second light bundles of rays L10$b$ incident on the incident surface 12$a$, a case where eight light bundles of rays (91, 92, 93, 94, 95, 96, 97, and 98) are included is illustrated. Out of the eight second light bundles of rays L10$b$ emitted from the second light emission region 10$b$, some of the light bundle of rays (91, 92, 93, and 94) are incident on the third lens portion 12L of the second condensing optical system 12, and some remaining light bundle of rays (95, 96, 97, and 98) are incident on the fourth lens portion 12R of the second condensing optical system 12.

The second light bundle of rays (91, 92, 93, and 94) incident on the third lens portion 12L are condensed on the first condensing region 16$a$ to be incident on the second optical waveguide 14. The second light bundle of rays (95, 96, 97, and 98) incident on the fourth lens portion 12R are condensed on the second condensing region 16$b$ to be incident on the second optical waveguide 14. On the incident surface of the second condensing optical system 12, between an optical axis 12$d$ of the third lens portion 12L and an optical axis 12$e$ of the fourth lens portion 12R, the light bundle of rays (94 and 95) located at the center of the eight second light bundles of rays L10$b$ are located.

Figure 10:
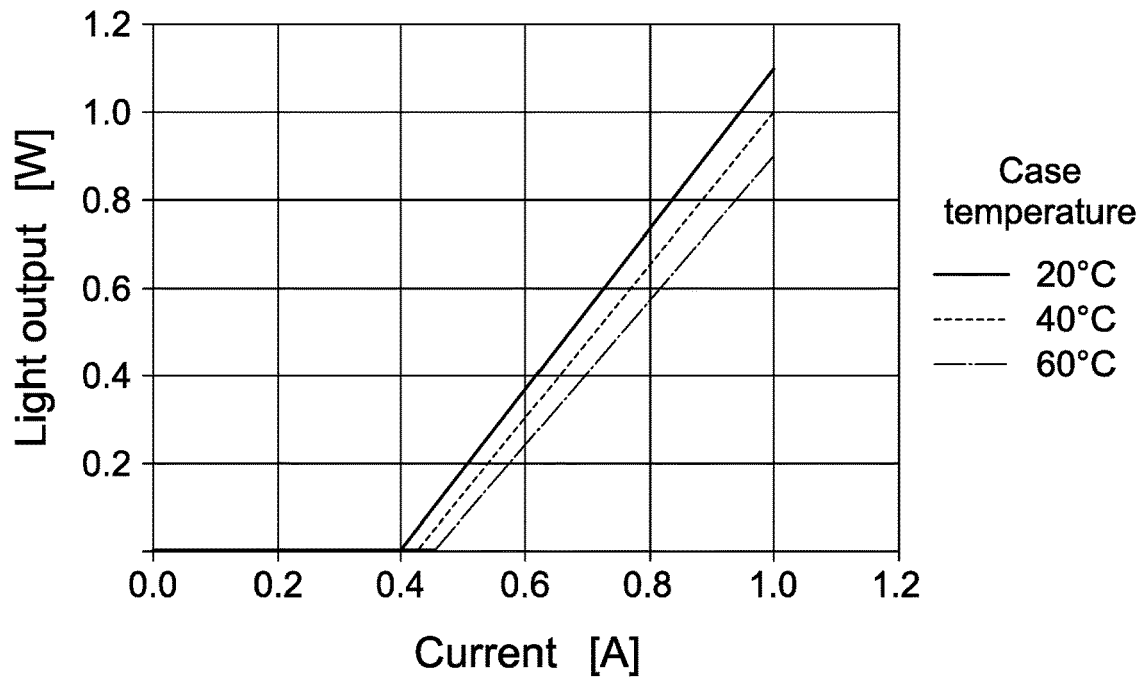
FIG. 10 is a view illustrating a temperature characteristic of a light output of the external resonator type semiconductor laser light source.

First, a temperature characteristic regarding a light output of an external resonator type semiconductor laser light source is described. FIG. 10 is a view illustrating a temperature characteristic of the light output of the external resonator type semiconductor laser light source. As illustrated in FIG. 10, in the external resonator type laser light source 10, the light output decreases as temperature increases. Therefore, when this is lit at a constant driving current, the temperature gradually increases due to heat generation, and the light output decreases. This depends on the temperature characteristic of the light output of a semiconductor device 101 which emits basic light.

In the laser light source 10 according to the third embodiment, as described above with reference to FIG. 1B, a plurality of light emitting units 102 which emits the basic light is arranged in an array. The light emitting units 102 arranged in an array generate heat by internal resistance when the driving current for emitting light is applied. Out of the light emitting units 102 arranged in an array, the light emitting unit 102 located on the center side which is less likely to radiate heat and is likely to be affected by heat of surrounding light emitting units 102, so that the temperature thereof becomes higher than that of the light emitting unit 102 located on an end side.

Therefore, the light output of the light emitting unit 102 located on the center side of the light emitting units 102 is more likely to be lower than that of the light emitting unit 102 located on the end side, and oscillation operation in the laser light source 10 is likely to stop. That is, there is a case where the light bundle of rays on the center side is not output in each of the light bundle of rays (L10$a$ and L10$b$) emitted from the light emission regions (10$a$ and 10$b$).

In the first embodiment and the second embodiment as illustrated in FIG. 4C and FIG. 7B, when the light output of the light bundle of rays (72, 73, 82, 83) on the center side is decreased or they are turned off, the light output from the optical waveguides (13 and 14) becomes light in which the light intensity at the center is extremely low or the light at the center is missing.

Therefore, by adopting the configuration as illustrated in FIGS. 9A and 9B, the light bundle of rays incident on a portion the closest to the optical axis 12$d$ of the third lens portion 12L are the light bundle of rays 92 and 93, and the light bundle of rays incident on a portion the closest to the optical axis 12e of the fourth lens portion 12R are the light bundle of rays 96 and 97, so that they are not the light bundle of rays (94 and 95) located at the center of the second light bundle of rays L10b.

For the similar reason, as for the first lens portion 11L and the second lens portion 11R forming the first condensing optical system 11, the light bundle of rays incident on the position closest to the optical axis is not the light bundle of rays located at the center of the first light bundle of rays L10a.

Therefore, if a lighting state of the light emitting unit 102 is continued for a long time, and the light output of the light emitting unit 102 out of a plurality of light emitting units 102 arranged at the center is decreased or this is turned off by the increase in temperature, so that the light bundle of rays (94 and 95) are no longer output, the light output from the optical waveguides (13 and 14) is not the light in which the light intensity at the center is extremely low or the light at the center is missing. That is, in a case where the temperature of the laser light source 10 rises and the light intensity of the light bundle of rays (94 and 95) decreases, it is possible to avoid significant decrease in the uniformity of the angular distribution of the light emitted from the light source device 1.

In the third embodiment, the first condensing optical system 11 and the second condensing optical system 12 have the same configuration, and the plurality of first light bundles of rays emitted from the first light emission region 10a and the plurality of second light bundles of rays emitted from the second light emission region 10b are incident on the incident surfaces (11a and 12a), respectively, in the same manner; however, it is also possible to configure such that the incident positions on the incident surfaces (11a and 12a) of the condensing optical systems (11 and 12) are different.

Another Embodiment

Hereinafter, another embodiment is described.

Figure 11:
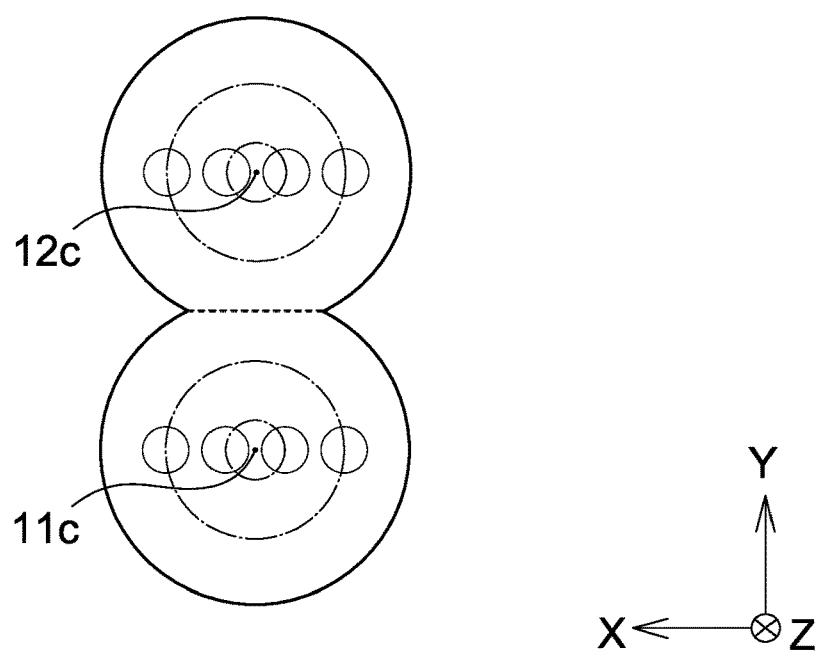
FIG. 11 is a schematic diagram when an incident surface of a condensing optical system in another embodiment of a light source device is seen from the laser light source side in a Z direction.

<1> FIG. 11 is a schematic diagram when incident surfaces of condensing optical systems (11 and 12) in another embodiment of a light source device 1 are seen from a laser light source side in a Z direction. As illustrated in FIG. 11, the first condensing optical system 11 and the second condensing optical system 12 may be combined to be integrated.

Figure 12:
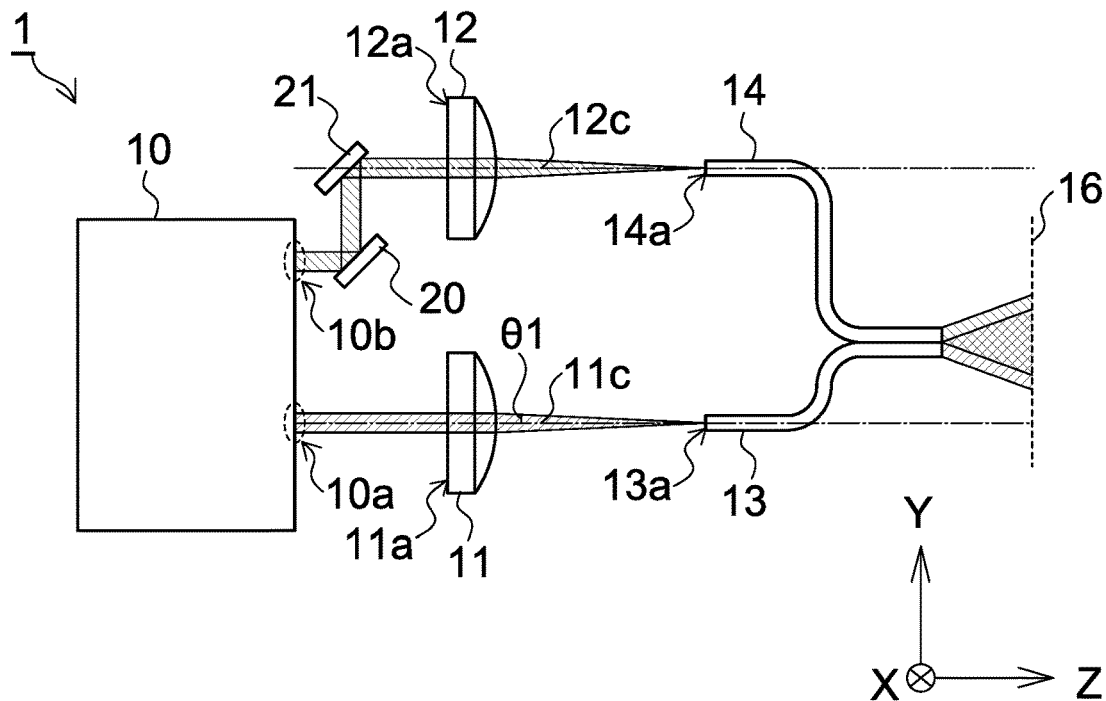
FIG. 12 is an YZ plane view schematically illustrating a configuration example of another embodiment of a light source device.

<2> FIG. 12 is an YZ plane view schematically illustrating a configuration example of another embodiment of a light source device 1. As illustrated in FIG. 12, light bundle of rays emitted from a first light emission region 10a or a second light emission region 10b may be guided to an arbitrary position using reflecting members (20 and 21) to be incident on incident surfaces (11a and 12a) of the condensing optical systems (11 and 12).

Figure 13A:
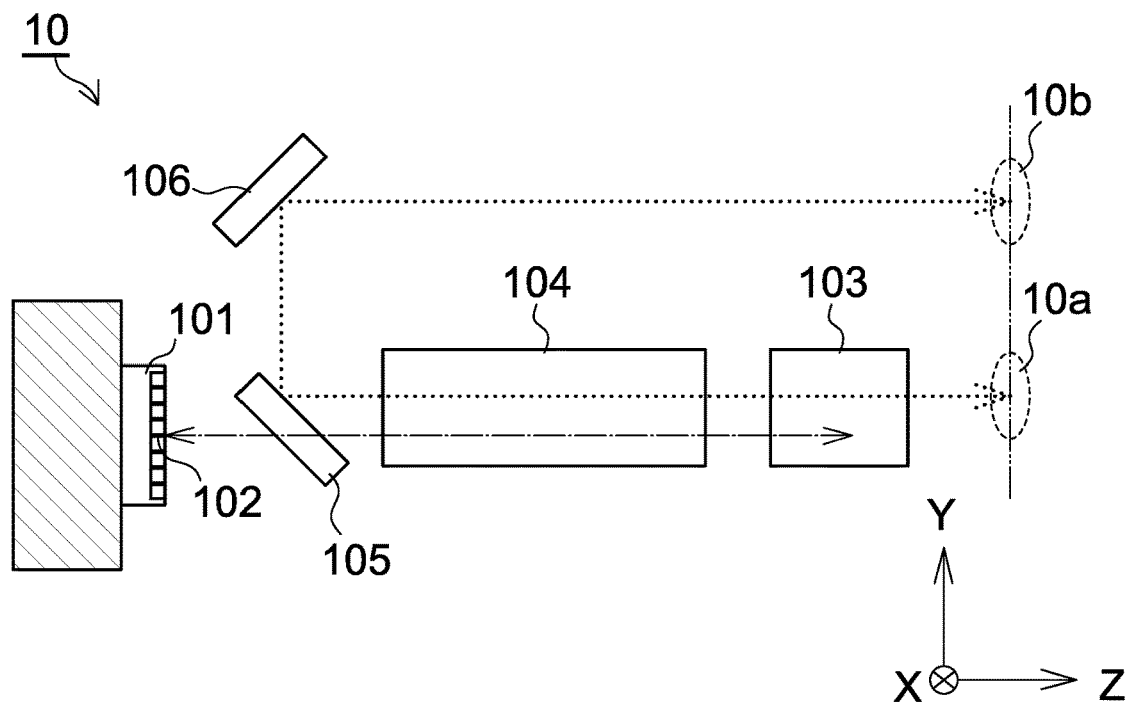
FIG. 13A is a side view schematically illustrating another embodiment of an external resonator type semiconductor laser light source.
Figure 13B:
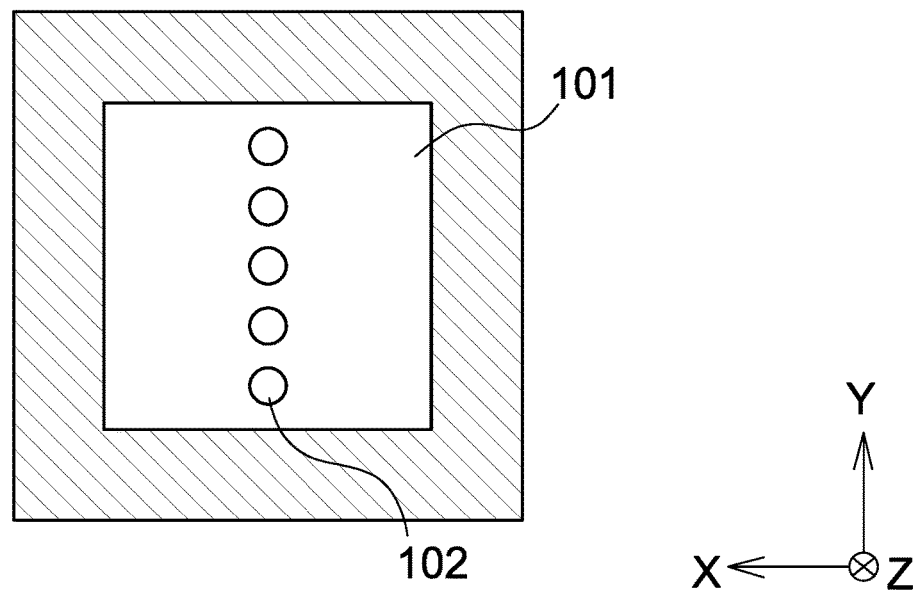
FIG. 13B is a schematic diagram when a semiconductor device in FIG. 13A is seen in a light emitting direction.

<3> FIG. 13A is a side view schematically illustrating another embodiment of an external resonator type semiconductor laser light source. FIG. 13B is a schematic diagram when a semiconductor device 101 in FIG. 13A is seen in a light emitting direction. As illustrated in FIGS. 13A and 13B, light emitting units 102 formed in the semiconductor device 101 may be arranged in an X direction. Furthermore, this may also be arranged so as to form a plurality of lines in both the X direction and the Y direction.

Figure 1B:
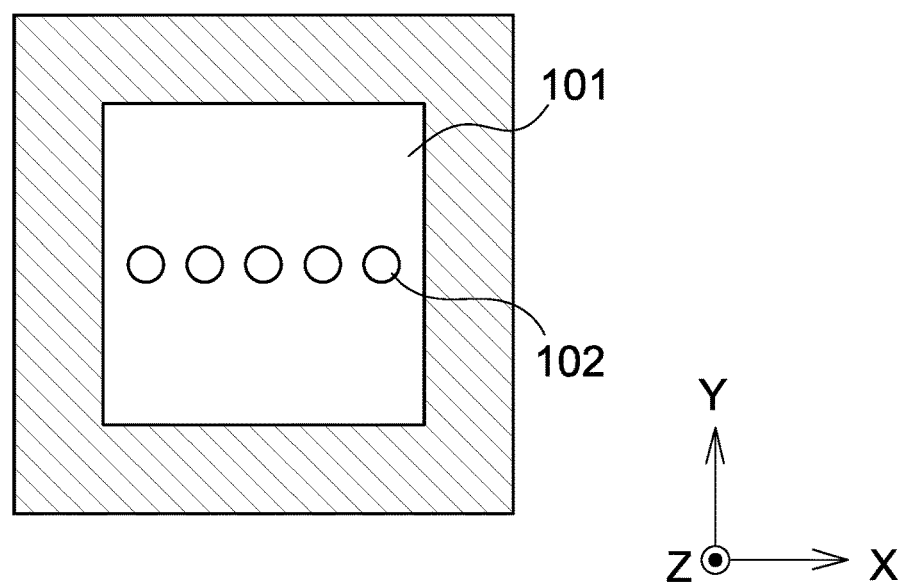
FIG. 1B is a schematic view when a semiconductor device in FIG. 1A is seen in a light emitting direction.

The light emitting units 102 formed on the semiconductor device 101 illustrated in FIGS. 1A and 1B are arranged in alignment in the X direction. Therefore, a plurality of light bundles of rays aligned in the X direction emitted from the light emission regions (10a and 10b) is emitted so as to be opposed to each other in the Y direction.

The light emitting units 102 formed on the semiconductor device 101 illustrated in FIGS. 13A and 13B are arranged in alignment in the Y direction. Therefore, all the light bundle of rays emitted from the light emission regions (10a and 10b) are emitted in alignment in the Y direction.

<4> The laser light source 10 described with reference to FIGS. 1A and 13A is described while taking a case where the VBG 103 which selectively reflects light in a specific wavelength band is included as the wavelength selection element as an example. However, a combination of an element (for example, an etalon filter or Thin Film Filter (TFF)) which selects the light in the specific wavelength band and a dichroic mirror may also be used.

What is claimed is:

1. A light source device comprising:
    an external resonator type semiconductor laser light source that includes a wavelength conversion element and emits light having a wavelength converted by the wavelength conversion element from a first light emission region and a second light emission region different from the first light emission region;
    a first optical waveguide and a second optical waveguide that each include an incident surface having a circular shape and emit light from light emission surfaces to a same irradiation surface;
    a first condensing optical system that condenses a plurality of first light rays emitted from the first light emission region on the incident surface of the first optical waveguide; and
    a second condensing optical system that condenses a plurality of second light rays emitted from the second light emission region on the incident surface of the second optical waveguide.

2. The light source device according to claim 1, wherein a separation distance $d1a$ between a principal light ray of first specific light bundle of rays incident in a position closest to an optical axis of the first condensing optical system out of the plurality of first light bundle of rays incident on an incident surface of the first condensing optical system and the optical axis of the first condensing optical system is shorter than a separation distance $d1b$ between the principal light ray of the first specific light bundle of rays and a principal light ray of the first light bundle of rays adjacent to the first specific light bundle of rays, and
    a separation distance $d2a$ between a principal light ray of second specific light bundle of ray incident in a position closest to an optical axis of the second condensing optical system out of the plurality of second light bundles of rays incident on an incident surface of the second condensing optical system and the optical axis of the second condensing optical system is shorter than a separation distance $d2b$ between the principal light ray of the second specific light bundle of rays and a principal light ray of the second light bundle of rays adjacent to the second specific light bundle of rays.

3. The light source device according to claim 2, wherein a difference between the separation distance $d1a$ and the separation distance $d2a$ is not smaller than ¼ and not larger than ½ of the separation distance $d1b$ or the separation distance $d2b$.

4. The light source device according to claim 1, wherein the first condensing optical system includes a first lens portion on which a part of the plurality of first light bundles of rays is incident to be condensed in a first condensing region on the incident surface of the first optical waveguide, and a second lens portion on which another part of the plurality of first light bundles of rays is incident to be condensed in a second condensing region different from the first condensing region on the incident surface of the first optical waveguide, and a principal light ray of light bundle of rays located at center of the plurality of first light bundles of rays is located between an optical axis of the first lens portion and an optical axis of the second lens portion on the incident surface of the first condensing optical system.

5. The light source device according to claim 4,
wherein the second condensing optical system includes a third lens portion on which a part of the plurality of second light bundle of rays is incident to be condensed in a third condensing region on the incident surface of the second optical waveguide, and a fourth lens portion on which another part of the plurality of second light bundle of rays is incident to be condensed in a fourth condensing region different from the third condensing region on the incident surface of the second optical waveguide, and a principal light ray of light bundle of rays located at center of the plurality of second light bundles of rays is located between an optical axis of the third lens portion and an optical axis of the fourth lens portion on the incident surface of the second condensing optical system.

6. The light source device according to claim 1,
wherein the first condensing optical system and the second condensing optical system are combined to be integrated.

7. The light source device according to claim 1,
wherein the external resonator type semiconductor laser light source is provided with:

a semiconductor device that emits basic light;

a wavelength selection element that is arranged in a position farther than the wavelength conversion element as seen from the semiconductor device, forms an external resonator of the basic light together with the semiconductor device, and transmits conversion light obtained by converting a wavelength of the basic light by the wavelength conversion element to guide to the first light emission region, and a reflecting member which reflects the conversion light emitted from the wavelength conversion element in a direction of the semiconductor device and guides to the second light emission region.

8. The light source device according to claim 2,
wherein the first condensing optical system includes a first lens portion on which a part of the plurality of first light bundles of rays is incident to be condensed in a first condensing region on the incident surface of the first optical waveguide, and a second lens portion on which another part of the plurality of first light bundles of rays is incident to be condensed in a second condensing region different from the first condensing region on the incident surface of the first optical waveguide, and a principal light ray of light bundle of rays located at center of the plurality of first light bundles of rays is located between an optical axis of the first lens portion and an optical axis of the second lens portion on the incident surface of the first condensing optical system.

9. The light source device according to claim 3,
wherein the first condensing optical system includes a first lens portion on which a part of the plurality of first light bundles of rays is incident to be condensed in a first condensing region on the incident surface of the first optical waveguide, and a second lens portion on which another part of the plurality of first light bundles of rays is incident to be condensed in a second condensing region different from the first condensing region on the incident surface of the first optical waveguide, and a principal light ray of light bundle of rays located at center of the plurality of first light bundles of rays is located between an optical axis of the first lens portion and an optical axis of the second lens portion on the incident surface of the first condensing optical system.

10. The light source device according to claim 8,
wherein the second condensing optical system includes a third lens portion on which a part of the plurality of second light bundles of rays is incident to be condensed in a third condensing region on the incident surface of the second optical waveguide, and a fourth lens portion on which another part of the plurality of second light bundles of rays is incident to be condensed in a fourth condensing region different from the third condensing region on the incident surface of the second optical waveguide, and a principal light ray of light bundle of rays located at center of the plurality of second light bundles of rays is located between an optical axis of the third lens portion and an optical axis of the fourth lens portion on the incident surface of the second condensing optical system.

11. The light source device according to claim 9,
wherein the second condensing optical system includes a third lens portion on which a part of the plurality of second light bundles of rays is incident to be condensed in a third condensing region on the incident surface of the second optical waveguide, and a fourth lens portion on which another part of the plurality of second light bundles of rays is incident to be condensed in a fourth condensing region different from the third condensing region on the incident surface of the second optical waveguide, and a principal light ray of light bundle of rays located at center of the plurality of second light bundles of rays is located between an optical axis of the third lens portion and an optical axis of the fourth lens portion on the incident surface of the second condensing optical system.

12. The light source device according to claim 2,
wherein the first condensing optical system and the second condensing optical system are combined to be integrated.

13. The light source device according to claim 3,
wherein the first condensing optical system and the second condensing optical system are combined to be integrated.

14. The light source device according to claim 4,
wherein the first condensing optical system and the second condensing optical system are combined to be integrated.

15. The light source device according to claim 5,
wherein the first condensing optical system and the second condensing optical system are combined to be integrated.

16. The light source device according to claim 2,
wherein the external resonator type semiconductor laser light source is provided with:

a wavelength selection element that is arranged in a position farther than the wavelength conversion element as seen from the semiconductor device, forms an external resonator of the basic light together with the semiconductor device, and transmits conversion light obtained by converting a wavelength of the basic light by the wavelength conversion element to guide to the first light emission region, and 25 a reflecting member which reflects the conversion light emitted from the wavelength conversion element in a direction of the semiconductor device and guides to the second light emission region.

17. The light source device according to claim 3,
wherein the external resonator type semiconductor laser light source is provided with:
a wavelength selection element that is arranged in a position farther than the wavelength conversion element as seen from the semiconductor device, forms an external resonator of the basic light together with the semiconductor device, and transmits conversion light obtained by converting a wavelength of the basic light by the wavelength conversion element to guide to the first light emission region, and 25 a reflecting member which reflects the conversion light emitted from the wavelength conversion element in a direction of the semiconductor device and guides to the second light emission region.

18. The light source device according to claim 4,
wherein the external resonator type semiconductor laser light source is provided with:
a wavelength selection element that is arranged in a position farther than the wavelength conversion element as seen from the semiconductor device, forms an external resonator of the basic light together with the semiconductor device, and transmits conversion light obtained by converting a wavelength of the basic light by the wavelength conversion element to guide to the first light emission region, and 25 a reflecting member which reflects the conversion light emitted from the wavelength conversion element in a direction of the semiconductor device and guides to the second light emission region.

19. The light source device according to claim 5,
wherein the external resonator type semiconductor laser light source is provided with:
a wavelength selection element that is arranged in a position farther than the wavelength conversion element as seen from the semiconductor device, forms an external resonator of the basic light together with the semiconductor device, and transmits conversion light obtained by converting a wavelength of the basic light by the wavelength conversion element to guide to the first light emission region, and 25 a reflecting member which reflects the conversion light emitted from the wavelength conversion element in a direction of the semiconductor device and guides to the second light emission region.

20. The light source device according to claim 6,
wherein the external resonator type semiconductor laser light source is provided with:
a wavelength selection element that is arranged in a position farther than the wavelength conversion element as seen from the semiconductor device, forms an external resonator of the basic light together with the semiconductor device, and transmits conversion light obtained by converting a wavelength of the basic light by the wavelength conversion element to guide to the first light emission region, and 25 a reflecting member which reflects the conversion light emitted from the wavelength conversion element in a direction of the semiconductor device and guides to the second light emission region.

\* \* \* \* \*